(12) United States Patent
Chaki

(10) Patent No.: US 7,953,997 B2
(45) Date of Patent: May 31, 2011

(54) POWER AMPLIFIER

(75) Inventor: Shin Chaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 829 days.

(21) Appl. No.: 11/558,585

(22) Filed: Nov. 10, 2006

(65) Prior Publication Data

US 2007/0118776 A1 May 24, 2007

(30) Foreign Application Priority Data

Nov. 22, 2005 (JP) .................... 2005-337498

(51) Int. Cl.
*G06F 1/00* (2006.01)
*H03F 3/68* (2006.01)
*H01P 5/04* (2006.01)

(52) U.S. Cl. ............. 713/323; 713/300; 330/124 R; 333/24 R

(58) Field of Classification Search .......... 713/323, 713/300; 330/124 R; 333/24 R
See application file for complete search history.

(56) References Cited

U.S. PATENT DOCUMENTS

| | | | | |
|---|---|---|---|---|
| 3,708,754 A | * | 1/1973 | Diehl ...................... | 330/1 A |
| 3,810,031 A | * | 5/1974 | Poujois .................... | 330/6 |
| 4,081,757 A | * | 3/1978 | Rumbaugh ............ | 330/124 R |
| 4,415,883 A | * | 11/1983 | von Sichart ............ | 341/133 |
| 6,232,840 B1 | * | 5/2001 | Teeter et al. ............ | 330/295 |
| 6,236,239 B1 | * | 5/2001 | Kogushi .................. | 326/88 |
| 6,462,622 B1 | | 10/2002 | Mori et al. | |
| 6,700,444 B2 | * | 3/2004 | Pengelly ................ | 330/295 |
| 6,703,894 B1 | * | 3/2004 | Stockstad et al. ....... | 327/552 |
| 6,744,312 B2 | * | 6/2004 | White et al. ............ | 330/51 |
| 6,876,270 B2 | | 4/2005 | Ono et al. | |
| 6,940,354 B2 | * | 9/2005 | Kang et al. ............. | 330/295 |

FOREIGN PATENT DOCUMENTS

| | | | |
|---|---|---|---|
| JP | 6-268458 A | | 9/1994 |
| JP | 06268458 A | * | 9/1994 |
| JP | 9-307367 A | | 11/1997 |
| JP | 11-355015 | | 12/1999 |
| JP | 2002-353745 | | 12/2002 |
| JP | 2003-87063 A | | 3/2003 |
| JP | 2003-297924 A | | 10/2003 |
| JP | 2005-216943 A | | 8/2005 |

OTHER PUBLICATIONS

Wikipedia, Power dividers and directional couplers, pp. 1-8.*
Computer-generated English language translation of JP 06268458 A, 16 pages, generated Sep. 2010.*
Human-generated English language translation of JP 06268458 A, 14 pages, prepared Oct. 2010.*

* cited by examiner

*Primary Examiner* — Stefan Stoynov
(74) *Attorney, Agent, or Firm* — Leydig, Voit & Mayer, Ltd.

(57) ABSTRACT

A power amplifier includes a power distribution circuit which distributes an input signal into signals and outputs the signals, amplification circuits which amplify the respective signals outputted from the power distribution circuit, a power combining circuit which combines the respective signals outputted from the amplification circuits and outputs the combined signal, and a stabilization circuit connected to an input line of the power distribution circuit. The stabilization circuit has a capacitance and a resistance connected in parallel.

13 Claims, 7 Drawing Sheets

POWER AMPLIFIER

BACKGROUND OF THE INVENTION

1. Field of the Invention

The present invention relates to a power amplifier provided with a power distribution circuit which distributes an input signal into a plurality of signals and outputs the signals, a plurality of amplification circuits which amplify the respective signals outputted from the power distribution circuit and a power combining circuit which combines the respective signals outputted from the plurality of amplification circuits and outputs the combined signal, and more particularly, to a power amplifier which is capable of reducing the chip size and advantageous from the standpoint of stable production.

2. Background Art

FIG. 13 is a circuit diagram showing a conventional power amplifier. This power amplifier is constructed of a power distribution circuit 11 which distributes an input signal into four signals and outputs the signals, four amplification circuits 12 such as FETs and HBTs which amplify the respective signals outputted from the power distribution circuit 11 and a power combining circuit 13 which combines the respective signals outputted from the four amplification circuits 12 and outputs the combined signal. Furthermore, matching circuits 14, 15 are disposed between an input terminal and the power distribution circuit 11 and between an output terminal and the power combining circuit 13 respectively. High output can be obtained by causing a plurality of amplification circuits to operate in parallel in this way (e.g., see Japanese Patent Laid-Open No. 11-355015).

In such a power amplifier, a closed loop is formed because a power distribution circuit and a power combining circuit are used. When there are variations in the amplification circuits and circuit elements, loop oscillation occurs in this closed loop at a specific frequency, which causes the power amplifier to become unstable. Therefore, the conventional power amplifier disposes stabilization circuits 16 in series between the plurality of amplification circuits 12 and power distribution circuits 11 respectively to prevent loop oscillation. This allows stability to be improved with stability factor K set to 1 or above in the close vicinity of the amplification circuits, and thereby makes it easier to suppress loop oscillation produced in the power combining power distribution circuits and facilitates the design of the whole circuit.

However, in the conventional power amplifier, a stabilization circuit needs to be provided for each of the plurality of amplification circuits, which increases the chip size and increases the cost. When, for example, a circuit made up of a resistor 17 and capacitor 18 connected in parallel is used as the stabilization circuit, the size in a direction perpendicular to the input/output direction is determined by the resistor 17 and capacitor 18. Furthermore, when an element requiring bias application is used in the stabilization circuit, it is necessary to increase the size in the input/output direction for leading out bias lines from the stabilization circuit disposed inside. Moreover, adopting a complicated structure to realize a multi-function stabilization circuit increases the area occupied by the stabilization circuit, and therefore it is difficult to realize such a structure when priority is given to a cost reduction. Furthermore, the conventional power amplifier includes numerous elements making up the stabilization circuit such as capacitors and resistors, which makes the amplifier more susceptible to variations in the respective elements and this is disadvantageous from the standpoint of stable production.

SUMMARY OF THE INVENTION

The present invention has been implemented taking into account the points described above and it is an object of the present invention to provide a power amplifier which is capable of reducing the chip size and advantageous from the standpoint of stable production.

According to one aspect of the present invention, a power amplifier of the present invention includes a power distribution circuit which distributes an input signal into a plurality of signals and outputs the signals, a plurality of amplification circuits which amplify the respective signals outputted from the power distribution circuit, a power combining circuit which combines the respective signals outputted from the plurality of amplification circuits and outputs the combined signal and a stabilization circuit connected to an input line of the power distribution circuit.

The present invention allows the chip size to be reduced, which is advantageous from the standpoint of stable production.

Other and further objects, features and advantages of the invention will appear more fully from the following description.

DETAILED DESCRIPTION OF THE PREFERRED EMBODIMENTS

Figure 1:
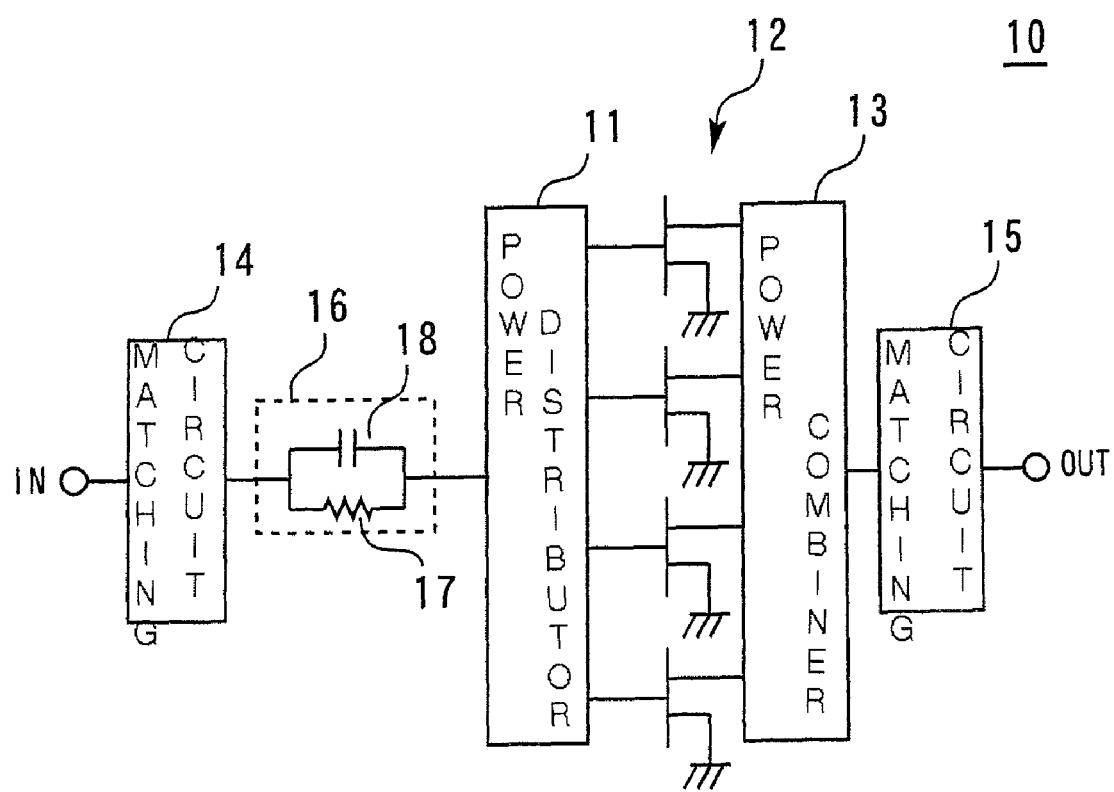
FIG. 1 is a circuit diagram showing a power amplifier according to First Embodiment of the present invention.

FIG. 1 is a circuit diagram showing a power amplifier according to First Embodiment of the present invention. This power amplifier 10 includes a power distribution circuit 11 which distributes an input signal into four signals and outputs the signals, four amplification circuits 12 such as FETs and HBTs which amplify the respective signals outputted from the power distribution circuit 11 and a power combining circuit 13 which combines the respective signals outputted from the four amplification circuits 12 and outputs the combined signal. There are also provided matching circuits 14, 15 between an input terminal and the power distribution circuit 11 and between an output terminal and the power combining circuit 13 respectively. Unlike the conventional power amplifier, the power amplifier according to this embodiment has a stabilization circuit 16 connected in series to an input line of the power distribution circuit 11.

Furthermore, the stabilization circuit 16 is a circuit constructed of a resistor 17 and a capacitor 18 connected in parallel. Note that the combination of the resistor 17 and capacitor 18 is not limited to a case where the number of the respective components is one, but can also be a plurality of resistors and one capacitor, a plurality of capacitors and one resistor or a plurality of capacitors and a plurality of resistors.

Figure 2:
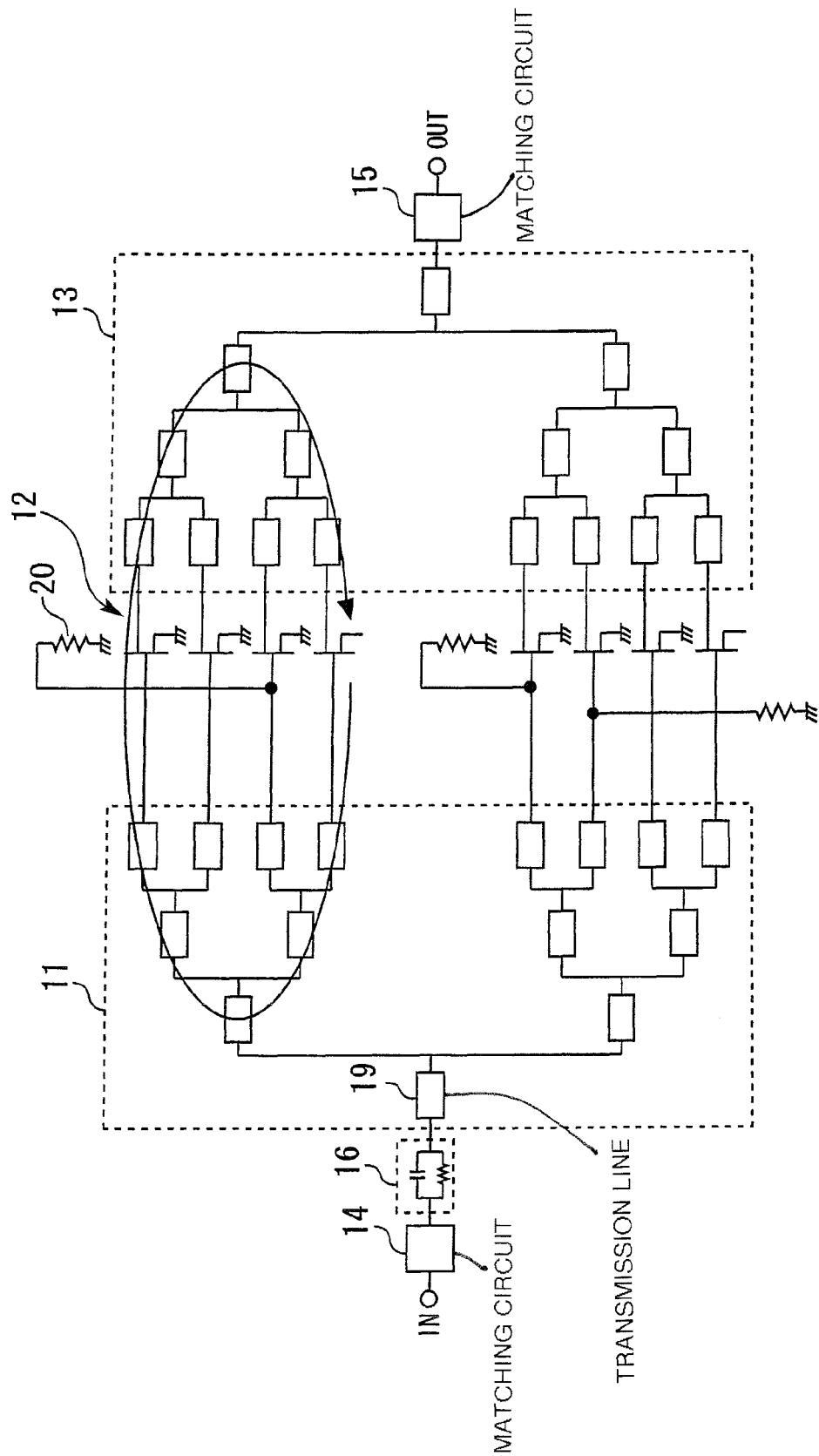
FIG. 2 is a circuit diagram showing a power amplifier used to calculate the stability of the power amplifier according to First Embodiment of the present invention.

FIG. 2 is a circuit diagram showing a power amplifier used to calculate the stability of the power amplifier according to First Embodiment of the present invention. The power distribution circuit 11 and power combining circuit 13 are constructed by cascading transmission lines 19 such as micro striplines. There is also provided an isolation resistor 20 to suppress loop oscillation.

Figure 3:
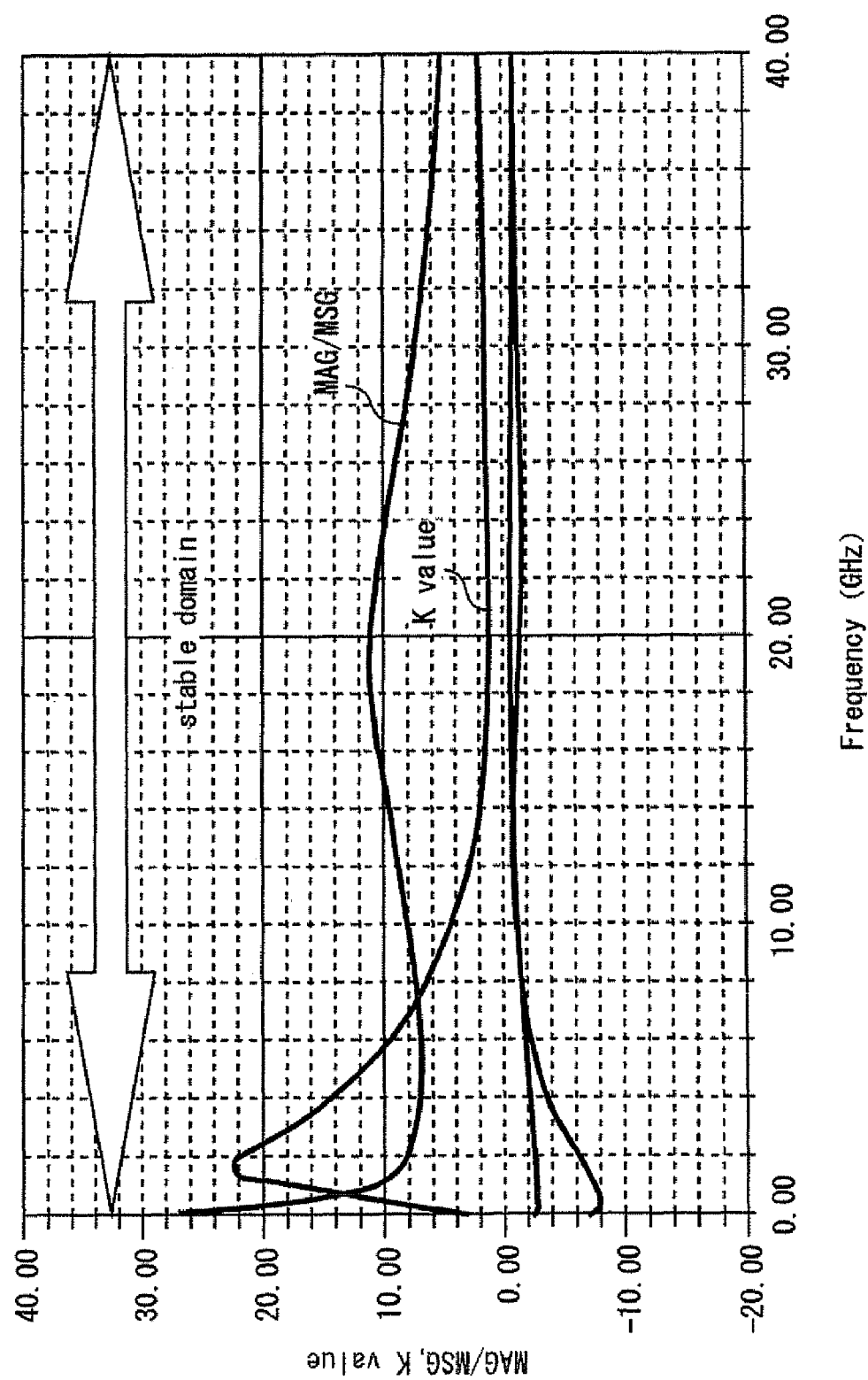
FIG. 3 shows calculation results of the frequency characteristics of Maximum Available Gain (MAG), Maximum Stable Gain (MSG) and stability factor K of the power amplifier shown in FIG. 2.

FIG. 3 shows calculation results of the frequency characteristics of Maximum Available Gain (MAG), Maximum Stable Gain (MSG) and stability factor K of the power amplifier shown in FIG. 2. A circuit configuration with eight amplification circuits arranged in parallel was used for the calculations. These calculation results showed that the K value is 1 or greater over the entire frequency range even when a stabilization circuit is connected in series to the input line of the power distribution circuit 11 and that MAG is obtained even in a low frequency range in which MSG is obtained when there is no stabilization circuit.

Furthermore, making the amplifier stably operate without oscillation requires not only stability of the K value but also suppression of loop oscillation. In the case of the conventional circuit, stabilization circuits were included in the loop, and therefore it was easy to suppress loop oscillation using them together with isolation resistors. In contrast, in the case of the power amplifier according to this embodiment, no stabilization circuit is included in the loop, and therefore it is necessary to carefully select an isolation resistance value to suppress loop oscillation. On the contrary, it has been conventionally difficult to find out an isolation resistance value which suppresses loop oscillation using only isolation resistors for such a reason that the calculation accuracy is insufficient or the like, but with the improvement of calculation technology in these days and the improvement of calculation technology such as electromagnetic field analysis, it is possible to find out such an isolation resistance value that suppresses loop oscillation using only isolation resistors.

Therefore, the power amplifier according to this embodiment can make the amplifier stably operate without oscillation by only providing one stabilization circuit in the input line of the power distribution circuit, and can thereby reduce the chip size and is advantageous from the standpoint of stable production.

Second Embodiment

Figure 4:
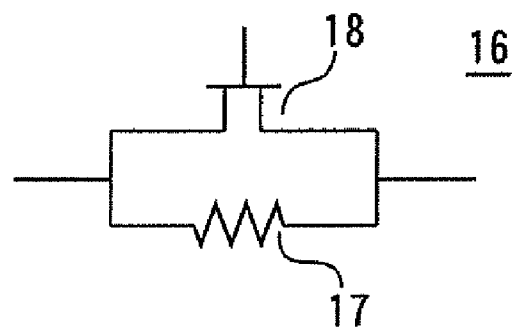
FIG. 4 is a circuit diagram showing a stabilization circuit according to Second Embodiment of the present invention.

In an MMIC, an MM capacitor is generally used as a capacitor 18. On the other hand, for a stabilization circuit according to Second Embodiment of the present invention, a transistor is used as the capacitor 18 as shown in FIG. 4. More specifically, the transistor is operated using the drain and source electrodes of the transistor as the input and output and applying a bias of a pinch-off voltage or below to the gate electrode thereof. This makes it possible to omit an MIM process and simplify a wafer process. When the gate width Wg of the transistor is assumed to be 5 mm, the capacitance is approximately 1 pf.

Third Embodiment

Figure 5:
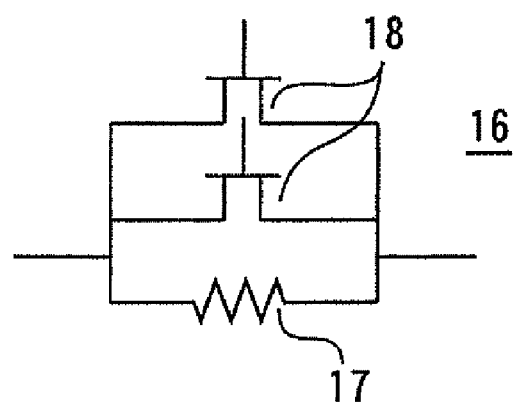
FIG. 5 is a circuit diagram showing a stabilization circuit according to Second Embodiment of the present invention.

In the case of a power amplifier that operates with a sub-millimeter wave or millimeter wave, attempting to obtain a relatively large capacitance with one transistor adversely affects the circuit characteristic because self resonance occurs due to influences of parasitic components or the like in the transistor. Therefore, a stabilization circuit according to Third Embodiment uses a plurality of transistors connected in parallel as a capacitor 18 as shown in FIG. 5. This can reduce a gate width Wg of each transistor, thereby avoid self resonance of the amplification circuit and use the transistor as a capacitor at a desired frequency.

Fourth Embodiment

The resistance value of a resistor 17 in a stabilization circuit 16 changes depending on an operating bias condition and operating temperature of the power amplifier. For example, the power amplifier operates stably under the operating bias condition but when the operation becomes unstable in the process leading to the operating bias condition, the resistance value should be determined in such a way that the most unstable area becomes stable in the case of the resistor 17 whose resistance value is fixed. However, such a resistance value has a possibility to change every process batch. Furthermore, when the operating ambient temperature of the whole circuit extends over a wide range, the circuit is normally designed so as to be stable at a low temperature, but this provides excessive stabilization during operation at a normal temperature, causing the gain even in a desired band to drop.

Figure 6:
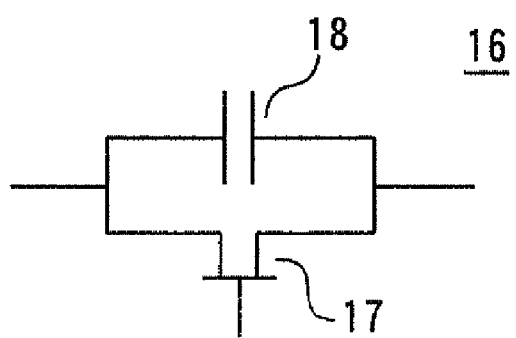
FIG. 6 is a circuit diagram showing a stabilization circuit according to Second Embodiment of the present invention.

Therefore, a stabilization circuit according to Fourth Embodiment of the present invention uses a transistor as a resistor 17 as shown in FIG. 6. More specifically, it applies a bias close to, for example, 0 V to the drain and source electrodes of the transistor. This makes it possible to adjust the resistance value of the resistor 17 according to the operating temperature and realize optimum stabilization at each temperature. When the gate width Wg of the transistor is assumed to be 10 μm, the resistance becomes approximately 100 Ω.

Fifth Embodiment

The resistance value in a stabilization circuit changes depending on the frequency and the gate width or the like of a transistor used as an amplification circuit, but when an attempt is made to obtain a resistance value of approximately 100 Ω with one transistor, the gate width Wg of the transistor used as the resistor may sometimes fall to or below 20 μm and the dependency of the gate width on the resistance value is large, which makes the design difficult.

Figure 7:
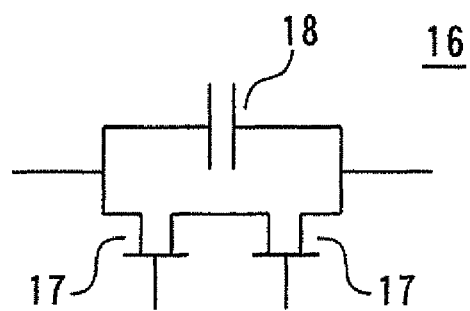
FIG. 7 is a circuit diagram showing a stabilization circuit according to Second Embodiment of the present invention.

Therefore, a stabilization circuit according to Fifth Embodiment of the present invention uses a plurality of transistors connected in series as a resistor 17 as shown in FIG. 7. Connecting large size (gate width) transistors in series in an amplification circuit makes it possible to easily realize a desired resistance value.

Sixth Embodiment

Figure 8:
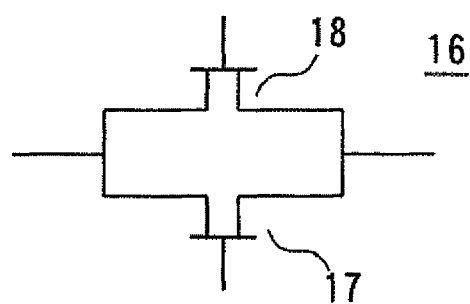
FIG. 8 is a circuit diagram showing a stabilization circuit according to Second Embodiment of the present invention.

FIG. 8 is a circuit diagram showing a stabilization circuit according to Sixth Embodiment of the present invention. The capacitor and resistor of this stabilization circuit consist of transistors. This allows the effect of Second Embodiment and the effect of Fourth Embodiment to be obtained simultaneously.

Seventh Embodiment

Figure 9:
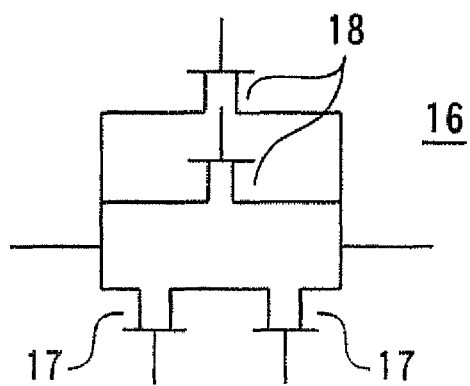
FIG. 9 is a circuit diagram showing a stabilization circuit according to Second Embodiment of the present invention.

A stabilization circuit according to Seventh Embodiment of the present invention uses a plurality of transistors connected in parallel as a capacitor 18 as shown in FIG. 9 and uses a plurality of transistors connected in series as a resistor 17. This allows the effect of Third Embodiment and the effect of Fifth Embodiment to be obtained simultaneously.

Eighth Embodiment

Figure 10:
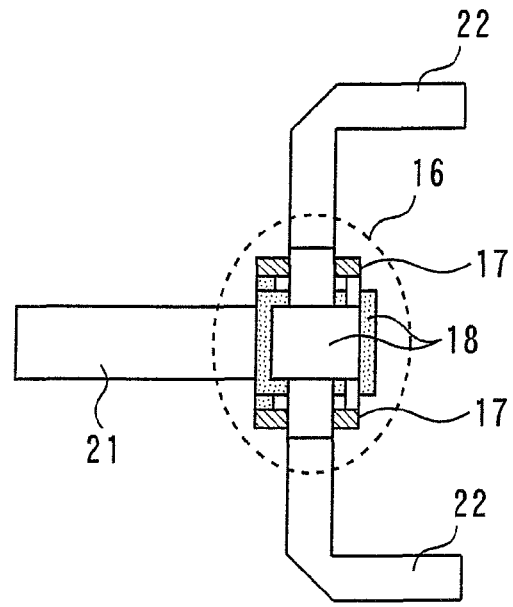
FIG. 10 is a circuit diagram showing a stabilization circuit according to Second Embodiment of the present invention.

Even when the number of stabilization circuits connected in series is one, the size in the input/output direction of a power amplifier cannot be reduced. Therefore, as shown in FIG. 10, in a stabilization circuit according to Eighth Embodiment of the present invention, a capacitor 18 and resistor 17 are disposed united to a cross section of an input line 21 and two lines 22 branched from this input line 21 of a power distribution circuit 11. More specifically, an MIM capacitor is disposed as the capacitor 18 in the cross section, two lines 22 are connected to an upper electrode of the MIM and the input line 21 is connected to a lower electrode of the MIM. The resistor 17 is disposed in the vicinity of the MIM below the two lines 22, one end of the resistor 17 is connected to the upper electrode of the MIM and the other end is connected to the lower electrode of the MIM. This allows the size in the input/output direction of the power amplifier to be reduced.

Ninth Embodiment

Figure 11:
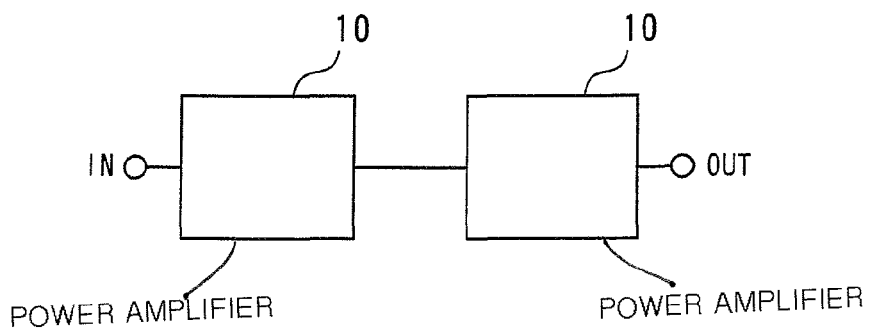
FIG. 11 is a circuit diagram showing a power amplifier according to Ninth Embodiment of the present invention.

FIG. 11 is a circuit diagram showing a power amplifier according to Ninth Embodiment of the present invention. This power amplifier includes a plurality of the power amplifiers 10 shown in FIG. 1 connected in series. This facilitates the circuit design for suppressing loop oscillation and allows an amplifier with larger power to be realized while taking full advantage of the merits of First Embodiment.

Tenth Embodiment

Figure 12:
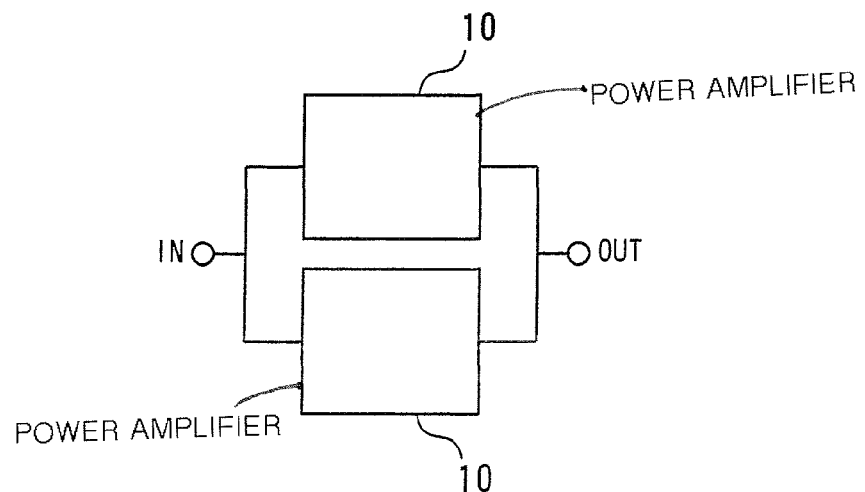
FIG. 12 is a circuit diagram showing a power amplifier according to Tenth Embodiment of the present invention.
Figure 13:
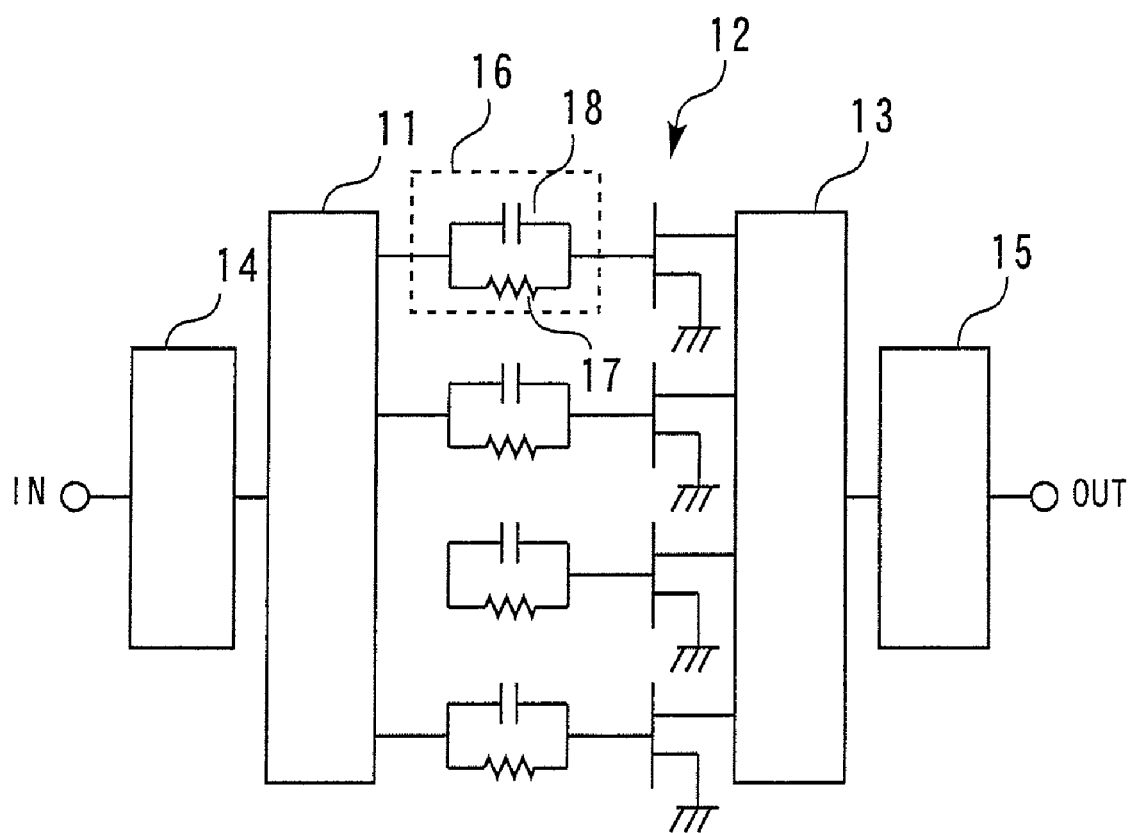
FIG. 13 is a circuit diagram showing a conventional power amplifier.

FIG. 12 is a circuit diagram showing a power amplifier according to Tenth Embodiment of the present invention. This power amplifier includes a plurality of the power amplifiers 10 shown in FIG. 1 connected in parallel. This produces effects similar to those of Ninth Embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-337498, filed on Nov. 22, 2005 including specification, claims, drawings and summary, on which the Convention priority of the present application is based, are incorporated herein by reference in its entirety.

What is claimed is:

1. A power amplifier comprising:
   a power distribution circuit which distributes an input signal into a plurality of signals and outputs the plurality of signals;
   a plurality of amplification circuits which amplify the respective signals output from the power distribution circuit;
   a power combining circuit that combines the respective signals output from the plurality of amplification circuits and outputs a combined signal, wherein a closed loop is defined by the power distribution circuit, the power combining circuit, and the plurality of amplification circuits; and
   only a single stabilization circuit, preventing oscillation of the power amplifier, the single stabilization circuit being connected to an input line of the power distribution circuit, wherein no stabilization circuits are present in the power amplifier within the closed loop.

2. The power amplifier according to claim 1, wherein the single stabilization circuit has a capacitance and a resistance connected in parallel.

3. The power amplifier according to claim 2, wherein the capacitance is supplied by a transistor.

4. The power amplifier according to claim 2, wherein the capacitance is supplied by a plurality of transistors connected in parallel.

5. The power amplifier according to claim 2, wherein the resistance is supplied by a transistor.

6. The power amplifier according to claim 3, wherein the resistance is supplied by a transistor.

7. The power amplifier according to claim 4, wherein the resistance is supplied by a transistor.

8. The power amplifier according to claim 2, wherein the resistance is supplied by a plurality of transistors connected in series.

9. The power amplifier according to claim 3, wherein the resistance is supplied by a plurality of transistors connected in series.

10. The power amplifier according to claim 4, wherein the resistance is supplied by a plurality of transistors connected in series.

11. The power amplifier according to claim 2, wherein the capacitance and the resistance of the single stabilization circuit are united with a cross section of an input line of the power distribution circuit and lines branched from the input line.

12. A power amplifier comprising a plurality of the power amplifiers according to claim 1 connected in series.

13. A power amplifier comprising a plurality of the power amplifiers according to claim 1 connected in parallel.

* * * * *